(12) United States Patent
Kerstein

(10) Patent No.: US 6,236,643 B1
(45) Date of Patent: May 22, 2001

(54) MULTIPORT DATA SWITCH HAVING VARIABLE MAXIMUM PACKET LENGTH

(75) Inventor: Denise Kerstein, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/993,832

(22) Filed: Dec. 18, 1997

Related U.S. Application Data

(60) Provisional application No. 60/038,025, filed on Feb. 14, 1997.

(51) Int. Cl.[7] .......................................................... H04J 3/22
(52) U.S. Cl. ............................ 370/254; 370/470; 370/465
(58) Field of Search ..................................... 370/252–254, 370/398, 400–402, 465, 466, 470–471, 389, 240

(56) References Cited

U.S. PATENT DOCUMENTS 5,515,376   5/1996  Murthy et al. .
5,991,817 * 11/1999  Rowett et al. ........................ 370/395
6,002,675 * 12/1999  Ben-Michael et al. ............... 370/389

* cited by examiner

*Primary Examiner*—Wellington Chin
*Assistant Examiner*—Maikhanh Tran

(57) ABSTRACT

A multiport data network switch includes a programmable Management Information Base (MIB) configuration register that serves as a reference for the Media Access Controller (MAC) at each port. The register is programmable for maximum packet length in two configurations. In a first configuration, the maximum packet length setting is constant for all ports. In the second configuration, the maximum packet length is set at a plurality of levels in accordance with certain dynamic conditions. On an untagged port, or on a tagged port capable of communicating with a Virtual Local Area Network (VLAN) that receives/transmits an untagged frame, the maximum packet length criterion is a first value. On a tagged port that receives/transmits a VLAN tagged frame, the maximum packet length criterion first level is expanded by the number of bytes required for the VLAN tag.

16 Claims, 6 Drawing Sheets

MULTIPORT DATA SWITCH HAVING VARIABLE MAXIMUM PACKET LENGTH

CROSS-REFERENCE TO RELATED APPLICATIONS

This application claims priority from provisional patent application Ser. No. 60/038,025, filed Feb. 14, 1997, the entire disclosure of which is hereby incorporated by reference herein.

Some of the subject matter disclosed in this application is similar to subject matter disclosed in applications Ser. No. 08/992,919, filed Dec. 18, 1997, now U.S. Pat. No. 6,108,342; Ser. No. 08/992,920, filed Dec. 18, 1997, now U.S. Pat. No. 6,029,197, and Ser. No. 08/992,817, filed Dec. 18, 1997, now U.S. Pat. No. 6,130,891.

TECHNICAL FIELD

The present invention relates to network switching and, more particularly, to setting the maximum packet length for data packets traversing a data network switch.

BACKGROUND ART

A data network switch permits data communication among a plurality of media stations in a local area network. Each station in the network is associated with a port of the switch. Data frames, or packets, are transferred between stations by means of data network switch media access control (MAC) circuitry for each switch port. The network switch passes data frames received from a transmitting station to a destination station based on the header information in the received data frame. The switch can link the network to other networks through a router connected to one or more switch ports.

Packet transmission events typically are tracked to provide a basis for statistical analysis of network operation with respect to each data network switch port. For example, the number of transmitted packets, received packets, transmission collisions and the like can be counted and polled periodically. These significant parameters, termed objects, may be collected in counters. The resulting information can be used to recognize improper device operation such as, for example, loss of packets.

Typically, each MAC unit may include a receive state machine and a transmit state machine having internal counters of limited capacity for counting a small number of transmission event parameters for each frame that traverses the respective switch port. Flip-flops, dedicated to the particular parameter objects, are respectively incremented each time an item in that frame is identified. For each incoming frame, which may be temporarily stored in a receive FIFO buffer, the respective flip-flops in the receive state machine are read and the resulting data are appended to the frame. For outgoing frames, similar processing takes place. This data traditionally has been stored on the chip in history or status registers.

As data networks become more robust and data traffic increases, additional operational parameters become significant. For example, ports may be operative with different transmission characteristics, such as different data rates and at half-duplex or full-duplex protocols. The need to track all significant parameters imposes difficulties relating to increased MAC complexity. Such complexity involves the provision of more registers and supporting logic elements, as well as a requirement for larger buffer capacities. Integration of these additional elements for each MAC on the switch logic chip places a burden on chip architecture. These projected difficulties, and the relatively limited reporting functionality for the prior art arrangements, are significant disadvantages.

Reference is made to the above-identified, commonly assigned, copending applications for more detailed discussion of the demands on chip architecture engendered by increased MAC complexity, increased number of switch ports and usage, and increased number of significant operational parameters. These applications address these problems by defining significant event parameters as objects of a Management Information Base (MIB). An Integrated Multiport Switch (IMS) includes all logic components on a single chip. The network switch architecture includes an on-chip "MIB engine" having a MIB report processor that enables monitoring of a large number of MIB objects by each on-chip MAC, ultimately to be stored in external memory, while minimizing MAC complexity. A MAC for each port in the switch outputs a MIB report for each transmission or reception of data according to a specific encoded format to the MIB engine. The MIB engine decodes the MIB report into a plurality of associated MIB objects, which are temporarily accumulated until the external memory is updated.

The various MIB objects are generated by the MAC at each port for each packet transmitted or received. For each significant parameter a packet characteristic is compared against a predefined standard. Compliance or noncompliance with the standard is counted, the result of the count for each parameter being included in the MIB report. One such significant parameter is maximum packet length. Of statistical interest is the number of transmitted or received packets that exceed the prescribed maximum packet length. For each packet, the MAC counts the number of data bytes, which number is accumulated until the end of the packet. The total number of bytes accumulated is compared with a maximum packet length criterion. The result is the basis for the generation of the maximum length MIB object of the generated MIB report for that packet.

Traditionally, the standard criterion for maximum packet length has been 1518 bytes, based on set allotted portions for header and information content. With a constant standard against which the packet length can be compared, the MAC can perform a simple operation to determine this MIB parameter. However, as switch and network functionalities have broadened, frames require additional header description indicative of added features. For example, the need exists for a network switch that will support virtual LANs (VLANs), for creating logical workgroups of users who may be physically separated from each other. VLAN groupings would provide privacy and security to their members. VLANs would also provide "broadcast domains" whereby broadcast traffic is kept "inside" the VLAN. These groupings can be thought of as "sub-networks" within a larger network. Data packets communicating in the VLAN would require a tag in the header that identifies the VLAN ID and type. The frame format for such packets is expanded relative to the standard frame format.

The generation of a MIB maximum packet length object thus becomes complicated. The maximum packet length for frames that do not have the VLAN tag would remain at 1518 bytes. The maximum packet length for frames that have the VLAN tag would be increased by the number of bytes required for the tag. In order to generate an accurate MIB report, the MAC must be provided with appropriate maximum packet length criterion for each packet. A VLAN tagged packet at maximum length would be counted as excessive if the traditional 1518 criterion were applied. Conversely, a non tagged packet of a length equal to the VLAN maximum would appear to be acceptable if the VLAN criterion were applied.

A further complication stems from the fact that not all ports would be qualified as VLAN ports. The tagging of VLAN ports would be a condition for applying the VLAN maximum length criterion. A VLAN tagged frame at maximum VLAN packet length from an untagged port should be indicated as an error as that port is not qualified for VLAN data traffic. Thus, for the latter situation, the standard 1518 maximum packet length criterion should apply.

The need thus exists for setting the maximum packet length criterion on a dynamic basis. As the association of ports with VLAN operation can be expected to change at irregular intervals, setting of the appropriate criterion must be flexible.

DISCLOSURE OF THE INVENTION

The present invention addresses the above noted needs and drawbacks of current network switches in part by providing a multiport switch with a programmable MIB configuration register that serves as a reference for the MAC at each port. The register is programmable for maximum packet length in two configurations. In a first configuration, the maximum packet length setting is constant for all ports, for example, at the standard 1518 bytes. This criterion corresponds to operation without the VLAN feature. In the second configuration, the maximum packet length is set in accordance with the following conditions. On an untagged port, or on a tagged port that receives/transmits an untagged frame, the maximum packet length criterion is the non-VLAN standard 1518 bytes. On a tagged port that receives/transmits a tagged frame, the maximum packet length criterion is increased to include the number of bytes required for the VLAN tag, for example up to 1522 bytes.

As the MAC will compare its accumulated byte count for each completed packet with the MIB configuration register reference, the maximum permissible packet length is dynamically variable. The identification of ports to be added for VLAN operation, or deleted therefrom, can be changed at will by the administrator without the need to change the MIB configuration register in its second configuration.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

BEST MODE FOR CARRYING OUT THE INVENTION

Figure 1:
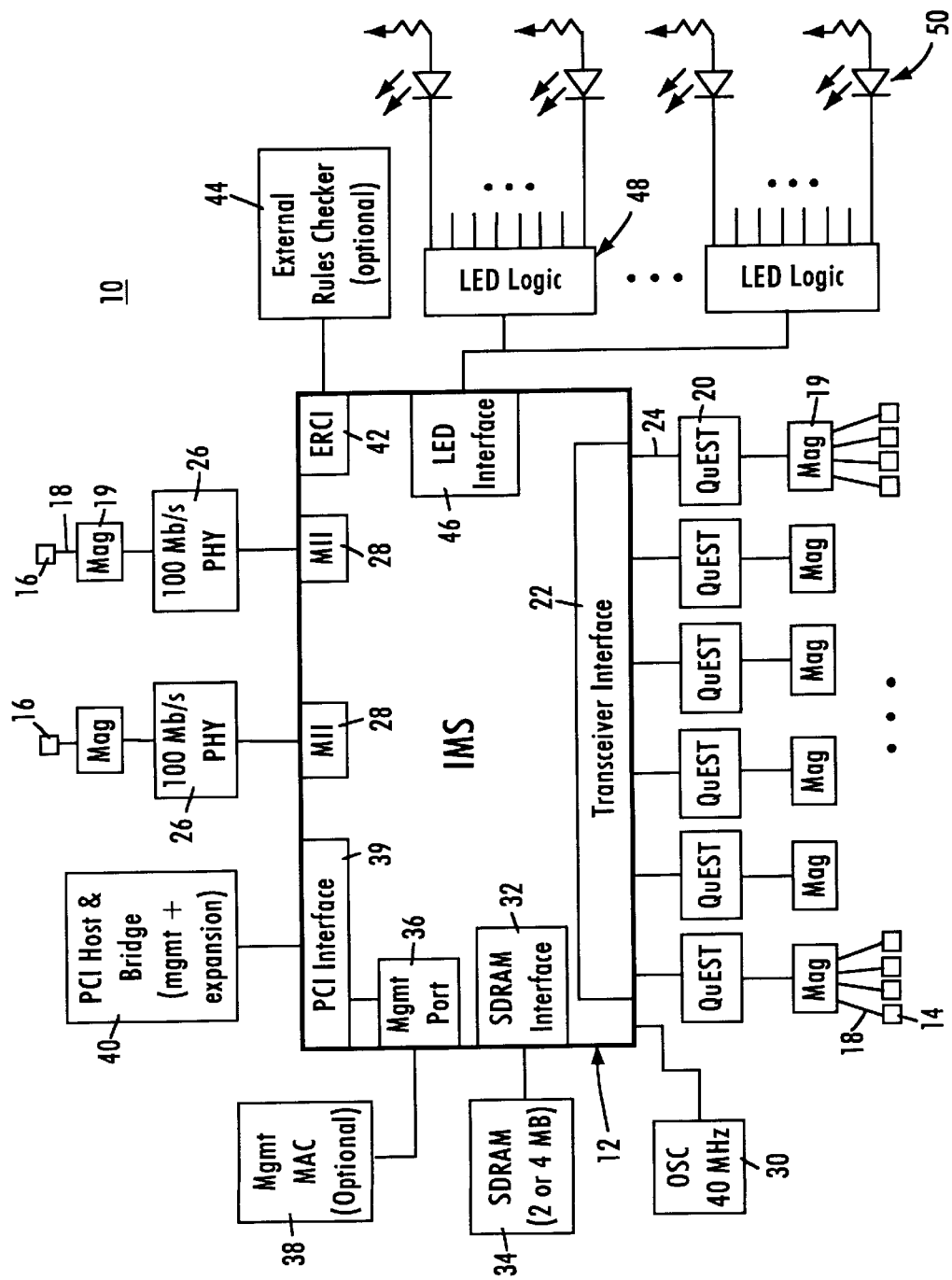
FIG. 1 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 1, is also applicable to other packet switched systems. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 may include an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 Mhz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2A:
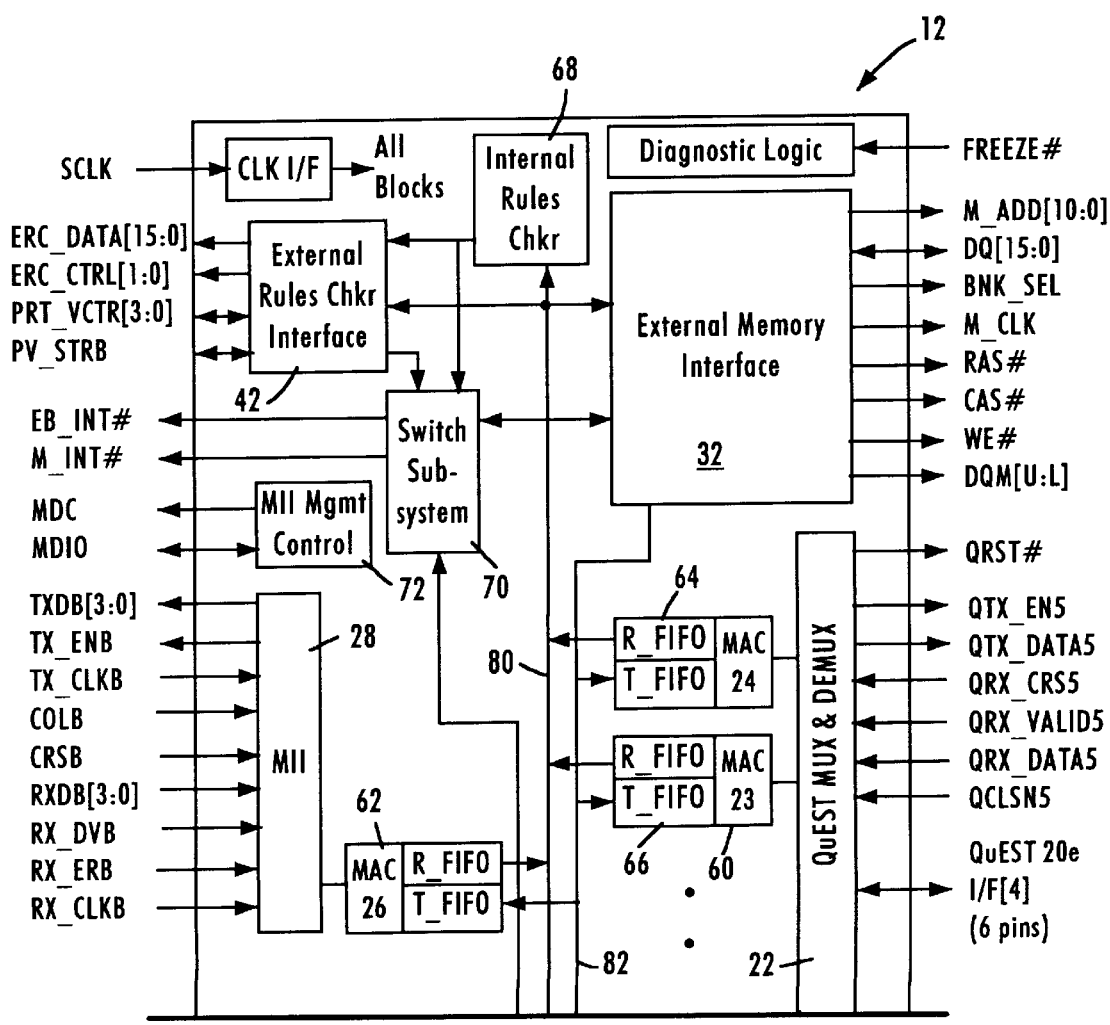
FIG. 2 is a block diagram of a multiport switch used in the packet switched system of FIG. 1.
Figure 2B:
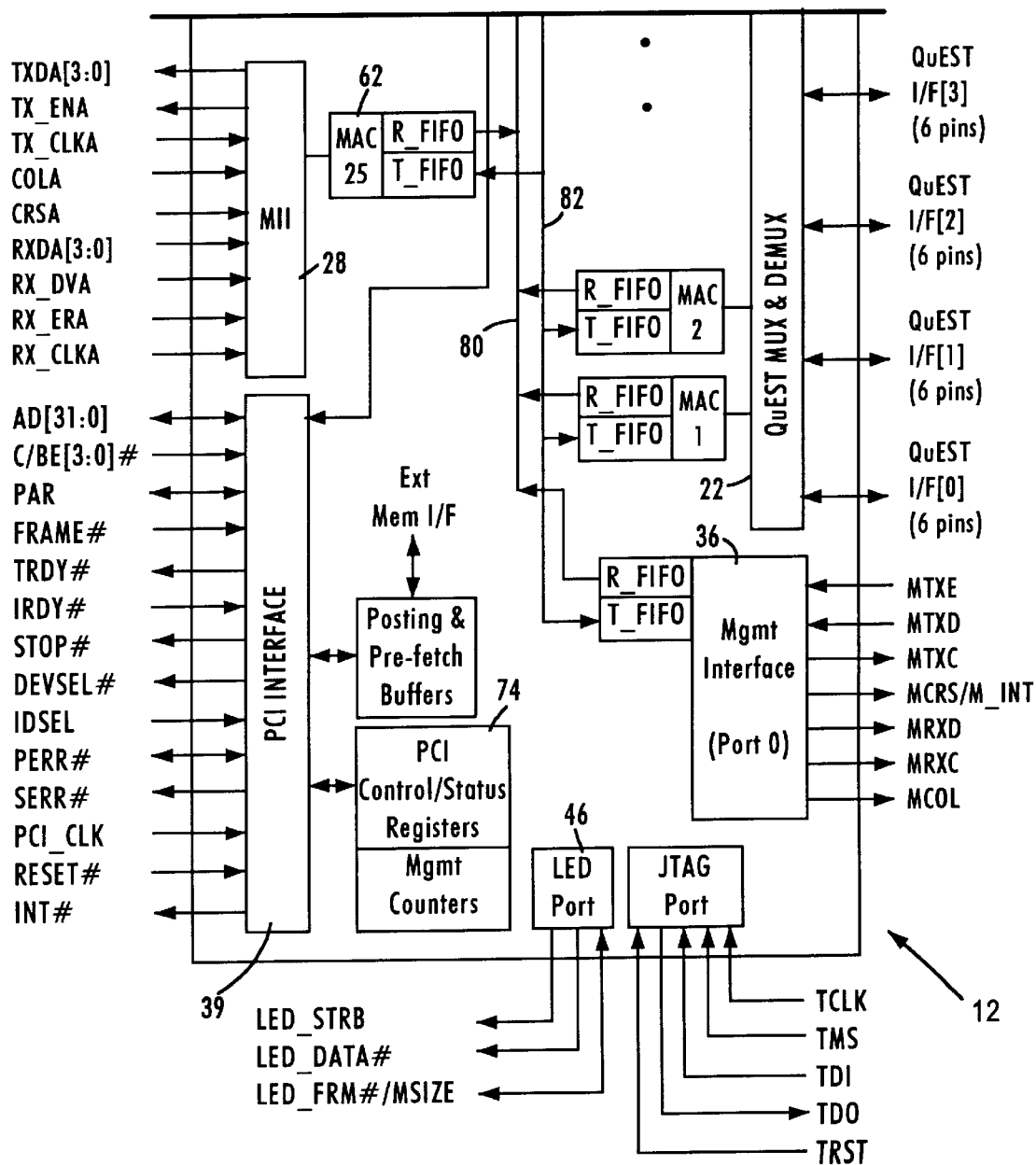

FIG. 2 is a more detailed block diagram example of the multiport switch 12 shown in FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO buffer 66. Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1 d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data 10 (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
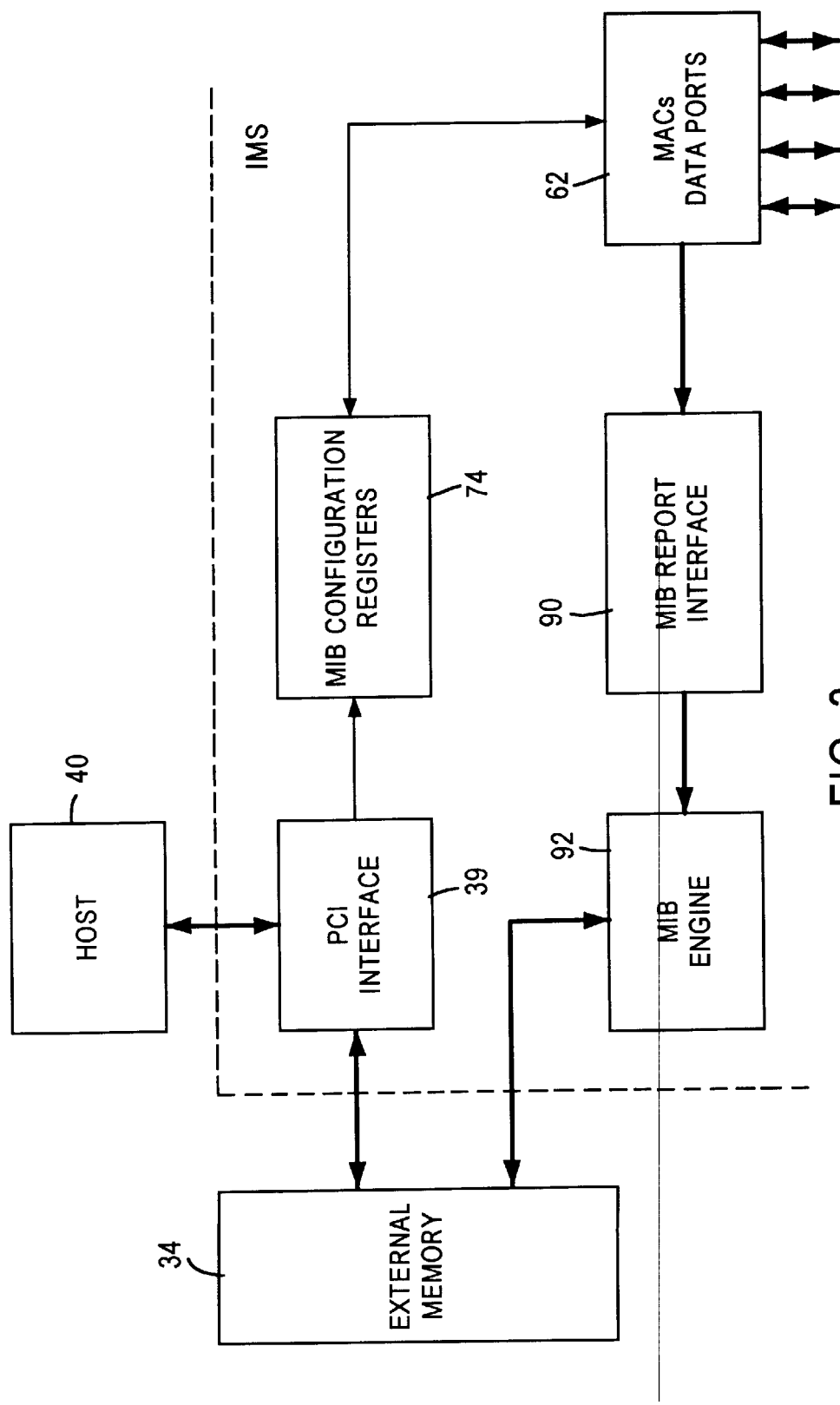
FIG. 3 is a partial block diagram relating to the processing and storage of MIB information in accordance with the invention.

The processing and storage of MIB information in accordance with the present invention is illustrated by the partial block diagram of FIG. 3. The dotted line boundary delineates a portion of the IMS logic chip. Each of MACs 60, 62, collectively illustrated as a single block, generates a MIB report that details the transmission activity at its port for each transmitted or received data frame. This data communication activity corresponds to traffic at the 10 Mb/s MAC ports (1–24) for MACs 60 and the 100 Mb/s MAC ports (25 and 26) for MACs 62 shown in the example illustration of FIG. 2. With respect to at least some of the MIB objects, the MACs refer to criteria stored in MIB configuration registers 74. These registers may be a portion of the registers shown in FIG. 2, under control of the host through the PCI interface 39. The MIB configuration registers are programmed by the host to provide a maximum packet length criterion in accordance with either of the two standards, to be explained more fully hereafter.

Each MIB report is formulated by the MAC according to a compression scheme whereby the report packet is allocated specific bit groupings, or fields, that correspond to particular MIB information. MIB reports from MACs 60 and 62 are output to a MIB report interface bus that feeds MIB report data to interface 90. Transmission of these reports and their timing sequences are more fully explained in the above-identified application Ser. No. 08/992,817, to which reference is made.

MIB report data are sequentially fed to the MIB engine from the MIB report interface. The MIB engine accumulates the received data in its own temporary RAM storage, associates the data with respective MIBs, and updates MIB information in the external memory 34. Counters preferably are grouped in memory by port. IMS MIB counters are mapped into the external memory 34 and are accessible to the PCI Host processor 40 through PCI interface 39. Only the lower n bits of all port MIBs are maintained on-chip while the full versions are in the external memory, thereby conserving on-chip RAM space. The full-length MIBs in the external memory are periodically transferred to the chip via control bus 94 and are updated before they are written back to the external memory via the control bus. The full-length MIB counters kept in the external memory can be accessed at any time, either by the external host or by the on-chip MIB engine for updating. Periodically, MIBs that belong to each port are brought from external memory into the IMS MIB engine to be updated.

Figure 4A:
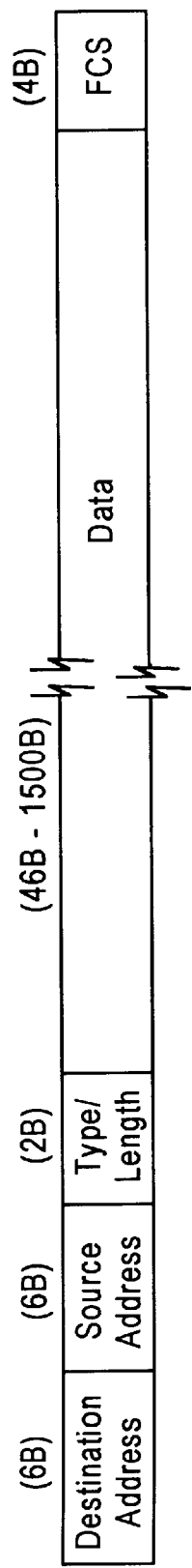
FIGS. 4a and 4b are diagrams that respectively illustrate untagged and tagged frame formats.
Figure 4B:
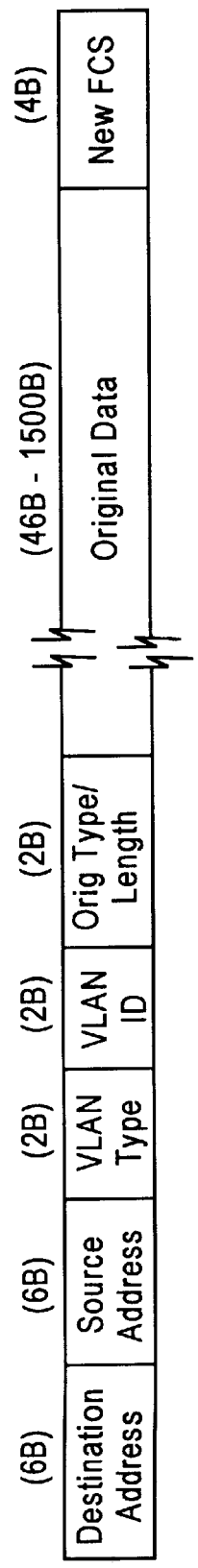
Figure 5:
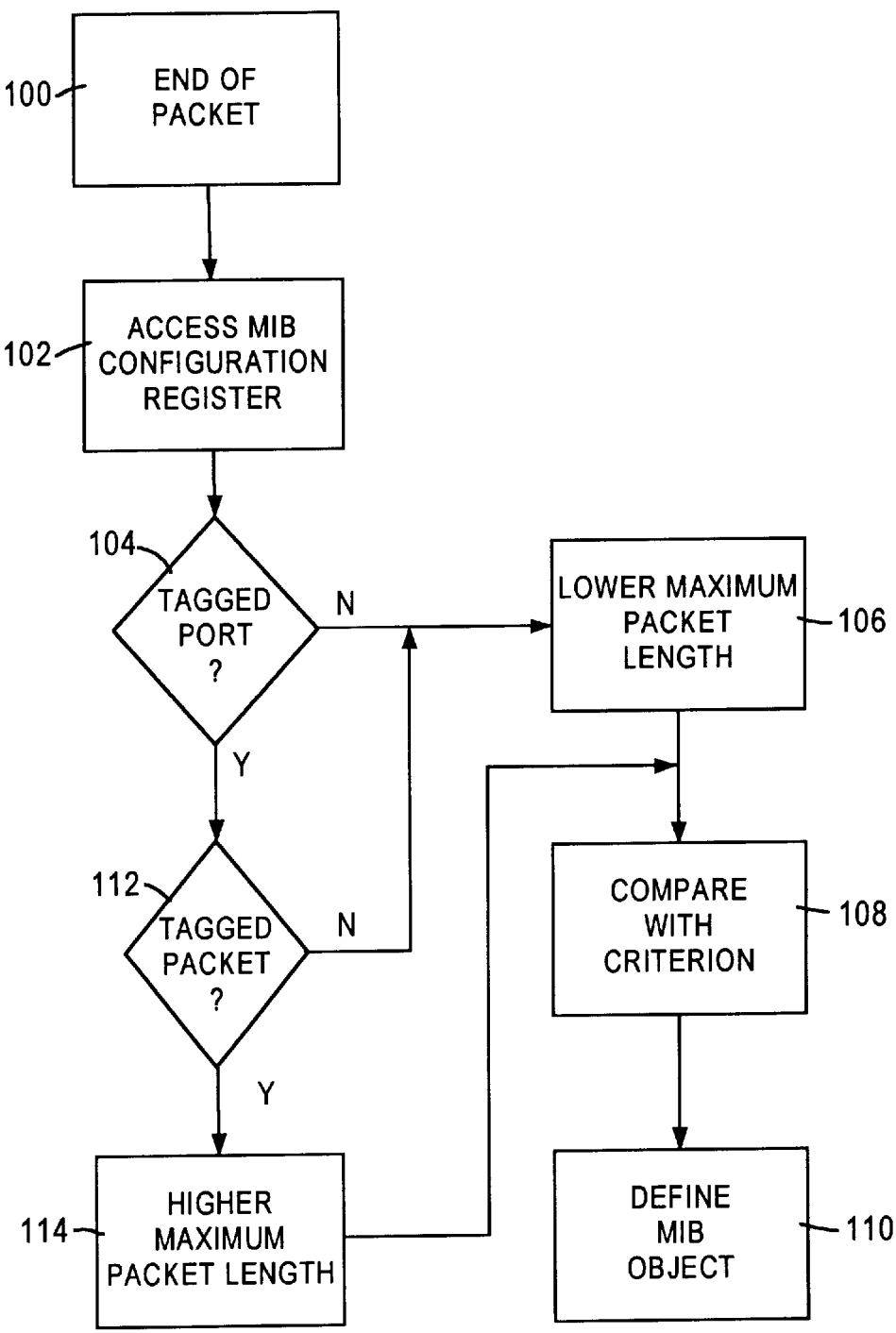
FIG. 5 is a flow chart for a process, according to the present invention, for determining maximum packet length for each frame on a dynamic basis.

Operation with respect to the generation of maximum length object portion of the MIB report is explained with respect to FIGS. 4a, 4b and 5. FIGS. 4a and 4b respectively illustrate untagged and tagged frame formats. The untagged frame format includes a header portion that allocates six bytes for destination address, six bytes for source address, and two bytes for type/length. The data portion is not fixed in length, but is within a permissible range between forty six and fifteen hundred bytes. A four byte frame check sequence (FCS) follows the data portion. Under Ethernet protocol, the maximum packet length for untagged packets is 1518 bytes.

The integrated multiport switch will allow VLAN tagged frames on certain ports. A VLAN tag in the ethernet switch example will contain a 32-bit value including a special 16-bit VLAN Ethertype, programmable in a 802.1d VLAN Ethertype register and a 16-bit VLAN Identifier (VLAN ID), as shown in FIG. 4b. As can be seen from these figures, the frame format for VLAN tagged frames is extended in length with respect to the untagged frames. The maximum packet length for such tagged packets is 1522 bytes.

The Host 40 is responsible for programming the 16-bit VLAN identifiers in a VLAN Index Table Register. VLANs may be either "port based" or "MAC based." Upon power-up, the Host assigns a VLAN Index to each port by programming a VLAN Port Index Table. The rules checker uses these values as a VLAN default. During runtime, as frames are received and addresses are learned, the Host can update a particular address with a new VLAN identifier.

The switch provides both tagged and untagged ports. In the example of FIG. 2, all twenty four 10 Mb/s ports are preferably untagged. The two 100 Mb/s ports may be tagged or untagged. If a port is untagged, frames received from this port are not checked for VLAN tags and frames transmitted to this port do not have VLAN tags inserted. If a port is tagged, frames received from this port are checked for VLAN tags. The VLAN identifier in the tag is stripped and written to the buffer header of the first buffer in external memory used to store the frame's data. If a tagged port's received frame contains a VLAN type that does not match the VLAN Ethertype register, the frame is assumed to be untagged. Frames transmitted to a tagged output port have VLAN tags inserted, unless the tagging is selectively overridden by the rules checker.

When a switch port receives a frame from a tagged port, it may or may not contain a VLAN tag. If a VLAN tag is found, the tag is extracted and the VLAN identifier is stored with the frame in external memory. The receive port sends the receive port number, frame pointer, destination and source addresses.

At the end of transmission or receipt of a data packet at a port, the MAC for that port formulates MIB object data for a MIB report that will be forwarded to the MIB engine. The objects are related to various parameters that are counted and compared to respective references. The maximum packet length parameter is compared against the applicable one of two criteria in the MIB configuration registers programmed by the host. One criterion is a fixed maximum packet length for all packets, which corresponds to the untagged frame format of 1518 bytes, shown in FIG. 4a. If this criterion is programmed into the MIB configuration register, the MAC will simply compare its packet length count against the fixed maximum packet length, regardless of whether there is provision for VLAN operation. The second criterion for maximum packet length specifies a plurality of values conditioned in accordance with the flow chart shown in FIG. 5.

FIG. 5 is a flow chart for the process, subject to the second applicable criterion, in which the MAC obtains the maximum packet length MIB object data to be generated with the MIB report. At step 100, the MAC counts bytes of data received or transmitted in the packet at the respective switch port. At the end of the packet, the MIB configuration register is accessed at step 102. Step 104 determines whether the port is a tagged port. If the packet is not from a tagged port the lower untagged maximum packet length criterion is applied at step 106. Compared with this criterion, at step 108, is the accumulated packet length obtained from the counter in step 100. The result of this comparison is embodied in the MIB report by the MAC in step 110. If the packet is from a tagged port, step 112 determines whether the packet is in the tagged format. If the packet is not tagged, the lower criterion is applicable and the flow reverts to step 108. If the packet is a tagged packet, the higher tagged maximum packet length criterion is applied at step 114 for comparison with the MAC in step 108.

The present invention thus provides the capability of programming alternative criteria for maximum permissible packet length, one criteria of which prescribes multiple levels on a dynamic basis for each packet. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method for configuring a data network switch having a plurality of ports for transmitting data packets to and receiving data packets from a data network, said method comprising the steps of:

selecting at least one of said ports;

setting a maximum packet length criterion for packets transmitted and received at said ports other than said at least one selected port; and adjusting said maximum packet length criterion between a plurality of values for each packet transmitted and received at said at least one selected port on a dynamic basis.

2. A method as recited in claim 1, wherein said adjusting step comprises the steps of:

determining whether each data packet traversing said at least one selected port contains a predetermined indicator; and extending said maximum packet length criterion for said traversing packet in response to a positive determination in said determining step.

3. A method as recited in claim 2, wherein said selecting step comprises tagging said at least one port for transmitting data packets to, and receiving data packets from, a virtual local area network.

4. A method as recited in claim 3, wherein said predetermined indicator is a tag identifying said traversing packet for communicating with said virtual local area network.

5. A method as recited in claim 4, wherein said tag is allotted a predetermined number of data bits in said traversing packet and said step of extending comprises adding said predetermined number of bits to said maximum packet length criterion.

6. A multiport data network switch for interfacing with a data network comprising:

a plurality of ports for transmitting data packets to and receiving data packets from said data network;

a media access controller (MAC) associated with each said port for generating management information base (MIB) data related to predefined parameters for each transmission of a data packet and reception of a data packet at the respective port; and a MIB configuration register having a data structure that contains a criterion for one of said predefined parameters.

7. A multiport data network switch as recited in claim 6, wherein said criterion is a maximum packet length value and said MIB data contains an indication of whether or not said maximum packet length has been exceeded by each data packet.

8. A multiport data network switch as recited in claim 7, wherein said data structure is programmable to a standard specifying a dynamically variable maximum packet length value at either a first level or a second level higher than said first level.

9. A multiport data network switch as recited in claim 8, wherein said standard is applicable for each data packet traversing said switch, said second maximum packet length value effective for packets being transmitted or received at a preselected one of said ports and containing a predefined data field.

10. A multiport data network switch as recited in claim 9, wherein said preselected port is connected for communication with a virtual local area network and said predefined field is indicative of a packet origination or destination assigned to said virtual local area network.

11. A method for setting a maximum packet length criterion for a data packet traversing a multiport data network switch comprising the steps of:

determining whether the port at which said data packet traverses is a tagged port;

setting said maximum packet length criterion at a first value in response to a result in said determining step that said port is not tagged;

detecting whether said data packet is a tagged packet;

setting said maximum packet length criterion at said first value in response to a non-tagged packet detecting step result; and setting said maximum packet length criterion at a second value in response to a tagged packet detecting step result.

12. A method as recited in claim 11, wherein said second value is higher than said first value.

13. A method as recited in claim 11, wherein said tagged port is capable of transmitting data packets to, and receiving data packets from, a virtual local area network.

14. A method as recited in claim 13, wherein said tagged packet originates from said virtual local area network.

15. A method as recited in claim 13, wherein said tagged packet contains a destination address for said virtual local area network.

16. A method as recited in claim 13, wherein said tagged packet contains a field identifying whether the packet is associated with said virtual local area network.

* * * * *